US010728705B2

(12) United States Patent
Tsukamoto

(10) Patent No.: US 10,728,705 B2
(45) Date of Patent: *Jul. 28, 2020

(54) FEATURE QUANTITY MEASURING DEVICE, RADIO WAVE ENVIRONMENT MEASURING DEVICE, FEATURE QUANTITY MEASURING METHOD, RADIO WAVE ENVIRONMENT MEASURING METHOD, AND PROGRAM

(71) Applicant: NEC Corporation, Minato-ku, Tokyo (JP)

(72) Inventor: Kenta Tsukamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/097,648

(22) PCT Filed: May 10, 2017

(86) PCT No.: PCT/JP2017/017759
§ 371 (c)(1),
(2) Date: Oct. 30, 2018

(87) PCT Pub. No.: WO2017/195842
PCT Pub. Date: Nov. 16, 2017

(65) Prior Publication Data
US 2019/0166461 A1    May 30, 2019

(30) Foreign Application Priority Data

May 13, 2016    (JP) ................................ 2016-096962

(51) Int. Cl.
*H04B 17/20*    (2015.01)
*H04W 4/02*    (2018.01)
(Continued)

(52) U.S. Cl.
CPC ............ *H04W 4/025* (2013.01); *G01R 29/08* (2013.01); *H04B 17/20* (2015.01); *H04B 17/309* (2015.01);
(Continued)

(58) Field of Classification Search
CPC .......... G01S 5/0263; G01S 5/16; G01S 5/021; G01S 1/68; G08G 1/08; G08G 1/04;
(Continued)

(56) References Cited

U.S. PATENT DOCUMENTS 5,889,488 A    3/1999 Kosaki
6,509,728 B1*  1/2003 Uchino .................. G01R 23/16
                                            324/76.13
(Continued)

FOREIGN PATENT DOCUMENTS

JP    07231286 A    8/1995
JP    08223108 A    8/1996
(Continued)

OTHER PUBLICATIONS

Sato, Koya et al., "Measurement-Based Spectrum Database for Flexible Spectrum Management", IEICE Trans. Commun., vol. E98-B, No. 10, Oct. 2015, pp. 2004-2013.

*Primary Examiner* — Marcus Hammonds

(57) ABSTRACT

In order to acquire a feature containing only a fluctuation component of a radio wave signal from received data, a feature quantity measuring device calculates the feature, based on data in a predetermined time span of time series data from a received communication signal, and calculates a degree of similarity between the feature and supervised data representing a preset feature when there is a fading variation. In addition, the feature quantity measuring device determines, based on a comparison result indicating a magnitude relationship between the degree of similarity and a (Continued)

predetermined threshold value, whether a characteristic of the fading variation is contained within the time span and, when the characteristic is not contained, outputs the feature for the time span.

9 Claims, 11 Drawing Sheets

(51) Int. Cl.
    *H04B 17/318*     (2015.01)
    *H04B 17/391*     (2015.01)
    *H04B 17/309*     (2015.01)
    *G01R 29/08*     (2006.01)
    *H04W 16/18*     (2009.01)

(52) U.S. Cl.
    CPC ....... *H04B 17/318* (2015.01); *H04B 17/3911* (2015.01); *H04W 16/18* (2013.01)

(58) Field of Classification Search
    CPC .. B60R 2021/0025; G06T 2207/20204; G06T 7/80; G06T 7/74; G06K 9/00785
    See application file for complete search history.

(56) References Cited

U.S. PATENT DOCUMENTS

| | | | |
|---|---|---|---|
| 7,974,654 B2 | 7/2011 | Tomioka et al. | |
| 8,768,260 B2* | 7/2014 | Tsukamoto | H04B 17/327 |
| | | | 455/63.1 |
| 9,460,327 B2* | 10/2016 | Kamiya | G01S 13/58 |
| 10,116,401 B2* | 10/2018 | Tsukamoto | G01R 29/08 |
| 2008/0240260 A1 | 10/2008 | Heidari et al. | |
| 2012/0007719 A1 | 1/2012 | Ida et al. | |
| 2012/0021710 A1* | 1/2012 | Tsukamoto | H04B 17/327 |
| | | | 455/226.1 |
| 2015/0382203 A1 | 12/2015 | Kitsunezuka | |

FOREIGN PATENT DOCUMENTS

| | | |
|---|---|---|
| JP | 10070504 A | 3/1998 |
| JP | 10206515 A | 8/1998 |
| JP | 2008167200 A | 7/2008 |
| JP | 2009115457 A | 5/2009 |
| JP | 2010109825 A | 5/2010 |
| JP | 5115938 B2 | 1/2013 |
| JP | 2013009413 A | 1/2013 |
| WO | 2010125842 A1 | 11/2010 |
| WO | 2013008886 A1 | 1/2013 |
| WO | 2014125931 A1 | 8/2014 |

* cited by examiner

FEATURE QUANTITY MEASURING DEVICE, RADIO WAVE ENVIRONMENT MEASURING DEVICE, FEATURE QUANTITY MEASURING METHOD, RADIO WAVE ENVIRONMENT MEASURING METHOD, AND PROGRAM

This application is a National Stage Entry of PCT/JP2017/017759 filed on May 10, 2017, which claims priority from Japanese Patent Application 2016-096962 filed on May 13, 2016, the contents of all of which are incorporated herein by reference, in their entirety.

TECHNICAL FIELD

The present invention relates to a feature quantity measuring device, a radio wave environment measuring device, a feature quantity measuring method, a radio wave environment measuring method, and a program.

BACKGROUND ART

As radio waves have been utilized in wider applications, it has been a challenge to balance avoiding interference and efficient frequency usage. For early detection of radio wave interference and sharing of radio wave resources, a technique has been proposed in which sensing of radio waves is performed to establish a radio wave environment database (NPL 1). The object of the technique is to detect interference as well as an available frequency band, and to facilitate utilization of frequency resources in secondary application by analyzing the radio wave environment database.

For early detection of interference or change in status of radio wave usage, it is necessary to densely dispose radio wave sensors and to frequently monitor the radio wave environment with respective radio wave sensors. Radio wave information to be monitored typically includes a received signal strength indicator (RSSI).

PTL 1 also discloses a technique for obtaining strength of a radio wave at a plurality of discrete observation points by calculation or measurement to determine a distribution of radio wave intensities. Since it is difficult to detect interference of radio waves of the same frequency by using only a single parameter such as the received signal strength indicator, in the technique of PTL 1, observation is performed using a statistic parameter having a different characteristic for each signal such as a modulation method as environmental information.

PTL 2 discloses a device for detecting interference of radio waves by utilizing a fact that an amplitude probability distribution is different for each signal modulation method. A statistic parameter such as an amplitude probability distribution may be used as a parameter for identifying a feature of a radio wave, and interference or the like may be identified using the feature by comparison with a case where only the received signal strength indicator is observed.

A problem in extracting a feature of a radio wave includes signal degradation due to fading. Fading is a phenomenon in radio communications in which radio waves that have arrived with a time difference interfere with each other, which affects intensity levels of the radio waves. The time difference between signals is generated by reflection of the radio waves at an obstacle on the ground, the ionosphere, or the like. In mobile communications, movement of a terminal itself for transmitting and receiving radio waves generates fading spatially and temporally. Variation of radio wave levels due to fading causes observation of something different from a characteristic of a communication signal that is supposed to be observed with radio wave sensors, which blocks radio wave monitoring. PTLs 3 to 9 also describe techniques for monitoring radio waves.

CITATION LIST

Patent Literature

PTL 1: Japanese Unexamined Patent Application Publication No. 2009-115457
PTL 2: Japanese Patent No. 5115938
PTL 3: WO 2014/125931
PTL 4: WO 2013/008886
PTL 5: Japanese Unexamined Patent Application Publication No. 2010-109825
PTL 6: Japanese Unexamined Patent Application Publication No. 1998-206515
PTL 7: Japanese Unexamined Patent Application Publication No. 1996-223108
PTL 8: WO 2010/125842
PTL 9: Japanese Unexamined Patent Application Publication No. 2013-009413

Non-Patent Literature

NPL 1: Koya Sato, Masayuki Kitamura, Kei Inage, and Takeo Fujii, "Measurement-Based Spectrum Database for Flexible Spectrum Management," IEICE Trans. Commun., vol. E98-B, no. 10, pp. 2004-2013, October 2015.

SUMMARY OF INVENTION

Technical Problem

In the related art described above, there is no mention of a technique for acquiring an effective feature of a radio wave under fading environment. Therefore, under fading environment, acquired data may include an effect of fading, which leads to a problem in which acquiring a more accurate feature of a communication signal (radio wave signal) is prevented.

Thus, the object of the present invention is to provide to a feature quantity measuring device, a radio wave environment measuring device, a feature quantity measuring method, a radio wave environment measuring method, and a program for the same, which solve the aforementioned problems.

Solution to Problem

According to a first aspect of the present invention, a feature quantity measuring device includes: an acquiring unit for acquiring time series data from a received communication signal; a feature quantity calculating unit for calculating a feature, based on data in a predetermined time span of the time series data; a degree of similarity calculating unit for calculating a degree of similarity between the feature based on the data in the time span and supervised data representing a preset feature when there is a fading variation; a fading detection unit for outputting a comparison result indicating a magnitude relationship between the degree of similarity and a predetermined threshold value; and a control unit for determining, based on the comparison result, whether a characteristic of the fading variation is contained within the time span and, when the characteristic is not contained, outputting the feature for the time span.

According to a second aspect of the present invention, a radio wave environment measuring device includes a database for acquiring and storing features, which are calculated by a plurality of the feature quantity measuring devices respectively disposed at spatially different positional coordinates, for the time span that does not contain the characteristic of the fading variation.

According to a third aspect of the present invention, a feature quantity measuring method includes: acquiring time series data from a received communication signal; calculating a feature, based on data in a predetermined time span of the time series data; calculating a degree of similarity between the feature based on the data in the time span and supervised data representing a preset feature when there is a fading variation; outputting a comparison result indicating a magnitude relationship between the degree of similarity and a predetermined threshold value; and determining, based on the comparison result, whether a characteristic of the fading variation is contained within the time span and, when the characteristic is not contained, outputting the feature for the time span.

According to a fourth aspect of the present invention, a radio wave environment measuring method includes acquiring and recording the feature, which is calculated by means of the aforementioned feature quantity measuring method, for the time span that does not contain the characteristic of the fading variation in a database.

According to a fifth aspect of the present invention, a program causes a computer of a feature quantity measuring device to function as: an acquiring means for acquiring time series data from a received communication signal; a feature quantity calculating means for calculating a feature, based on data in a predetermined time span of the time series data; a degree of similarity calculating means for calculating a degree of similarity between the feature based on the data in the time span and supervised data representing a preset feature when there is a fading variation; a fading detection means for outputting a comparison result indicating a magnitude relationship between the degree of similarity and a predetermined threshold value; and a control means for determining, based on the comparison result, whether a characteristic of the fading variation is contained within the time span and, when the characteristic is not contained, outputting the feature for the time span.

Advantageous Effects of Invention

The feature quantity measuring device, the radio wave environment measuring device, the feature quantity measuring method, the radio wave environment measuring method, and the program of the present invention may determine a time span that does not contain a fading variation by utilizing a fact that there is a difference between a period of the fading variation and a period of a signal symbol rate, measure a feature, and acquire a feature that contains only a fluctuation component of the signal.

In other words, a more accurate feature of a communication signal (radio wave signal) that does not include an effect of fading or that contain only a reduced effect of fading may be acquired.

EXAMPLE EMBODIMENT

First Example Embodiment (Description of the Configuration)

Hereinafter, a feature quantity measuring device according to a first example embodiment will be described with reference to the drawings.

Figure 1:
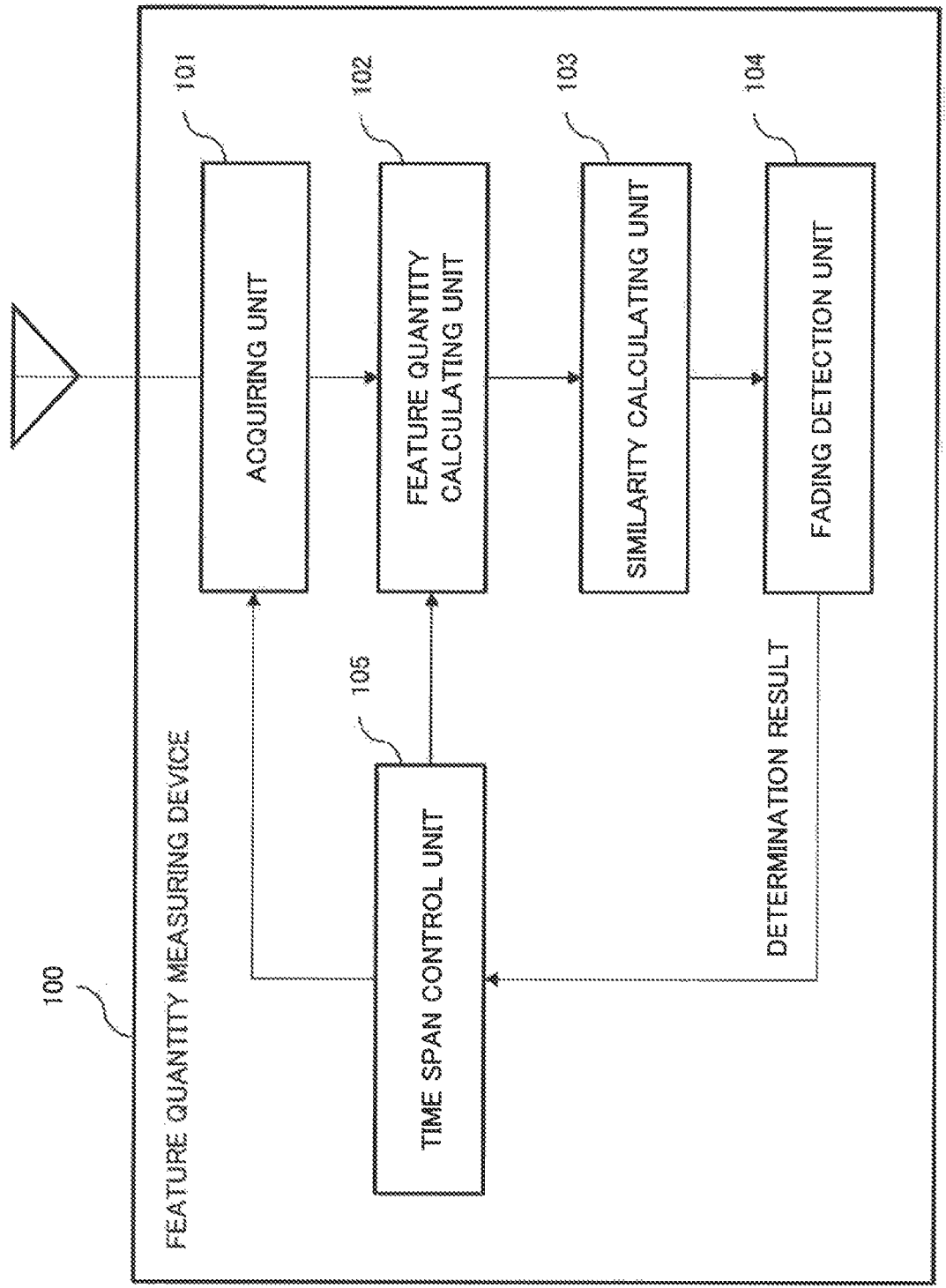
FIG. 1 is a block diagram illustrating a configuration of a feature quantity measuring device according to a first example embodiment of the present invention.

FIG. 1 is a block diagram illustrating a configuration of the feature quantity measuring device according to the first example embodiment.

A feature quantity measuring device 100 includes an acquiring unit 101, a feature quantity calculating unit 102, a similarity calculating unit 103, a fading detection unit 104, and a time span control unit 105. Each of these functions may be achieved by a circuit corresponding to each function, which is included in the feature quantity measuring device 100; alternatively, each function may be a function that is to be included in the feature quantity measuring device 100 by the feature quantity measuring device 100 executing a program.

The acquiring unit 101 is a processing unit that acquires information about a radio wave of a communication signal including disturbance such as noise and converts the information into data. The acquiring unit 101 acquires the information about the radio wave from a radio wave sensor, such as an antenna, supporting a desired frequency. The radio wave sensor is an aspect of a reception interface. Other aspects of the reception interface include a voltmeter, an electric field strength meter, and a spectrum analyzer, which can measure an amplitude for each frequency, and the feature quantity measuring device 100 may include these reception interfaces.

The acquiring unit 101 measures (samples) a frequency and an amplitude value of a radio wave for a predetermined time. The acquiring unit 101 repeats the measurement at each measurement position. The acquiring unit 101 converts variation of waveforms over time of the measured frequency and amplitude value of the radio wave into measurement data represented as time-series digital values. The acquiring unit 101 outputs the measurement data to the feature quantity calculating unit 102.

The feature quantity calculating unit 102 acquires the measurement data and calculates at least one feature from the measurement data. When the measurement data itself is retained or stored in a storage medium in the feature quantity measuring device 100, not only a large amount of memory resources are required, but also the processing becomes very slow and high load is applied to analytical processing of the acquired data. Converting the measurement data into at least one feature significantly decreases the amount of data, conserves the memory resources, and facilitates handling of information at a subsequent stage.

A type of the feature to be calculated by the feature quantity calculating unit 102 may be freely defined. As a feature of a radio wave, for example, a temporal statistic for amplitudes such as an amplitude probability distribution (APD) or an amplitude histogram, or a temporal statistic for phases such as a crossing rate distribution (CRD) may be defined as a feature. The amplitude probability distribution (APD) expressed by an equation 1 is a statistic based on measurement data including time-series amplitude values acquired from the acquiring unit 101, which represents a ratio of durations $T_i$ in which an amplitude envelop exceeds a specified amplitude value $E_k$ to a total measurement time T. The amplitude probability distribution is used as a rating scale for interfering waves of digital noise since it represents a relationship between noise occurrence frequency and amplitude strength.

[Math 1]

$$APD(E_k) = \frac{\sum_{i=1}^{h} T_i(E_k)}{T} \quad (1)$$

The crossing rate distribution (CRD) is a statistic represented by a ratio of a number of times $N_i$ that the amplitude envelope crosses the specified amplitude value $E_k$ in a positive direction (or a negative direction) to the total measurement time T (see the equation 2). The crossing rate distribution indicates a relationship between the number of amplitude fluctuations and amplitude strength of noise. When there is no overlapping among pulses, it gives the number of pulses having an amplitude exceeding the amplitude value $E_k$ per unit time.

[Math 2]

$$CRD(E_k) = \frac{N_i(E_k)}{T} \quad (2)$$

The feature quantity calculating unit 102 may calculate and output, other than the aforementioned statistics, one of statistics for a single parameter such as an average value or a peak value and statistics for different time series such as a pulse duration distribution (PDD), a pulse separation distribution (PSD), or a waiting time distribution (WTD), or a plurality of such statistics in combination with each other.

The feature quantity calculating unit 102 outputs feature information representing the calculated feature and the time span t used for calculation of the feature to the similarity calculating unit 103. In the equation 1 and the equation 2, the total measurement time T corresponds to the time span t. The similarity calculating unit 103 acquires supervised data for the feature of fading variations retained in advance and calculates a degree of similarity between a feature of a communication signal (radio wave signal) included in the feature information acquired from the feature quantity calculating unit 102 and the feature represented by the supervised data. The feature of the received communication signal and the supervised data respectively represent features the type of which are the same (for example, amplitude probability distributions). The similarity calculating unit 103 uses, for calculation of the degree of similarity, a technique commonly used in statistic calculation. For example, the similarity calculating unit 103 calculates the degree of similarity using a Pearson's product-moment correlation coefficient representing a degree of similarity between two variables. In this case, as the number is closer to one, it may be determined that similarity between the features of two variables is high and they have the same type of features. The Pearson's correlation coefficient r(x, y) is defined by an equation 3 when a data string (x, y)=((xi, yi)) (i=1, 2, ..., N), which consists of two sets of numerical values, is given.

[Math 3]

$$r(x, y) = \frac{\sum_{i=1}^{N}(x_i - \bar{x})(y_i - \bar{y})}{\sqrt{\sum_{i=1}^{N}|x_i - \bar{x}|^2} \sqrt{\sum_{i=1}^{N}|y_i - \bar{y}|^2}} \quad (3)$$

The similarity calculating unit 103 calculates a correlation coefficient representing the degree of similarity between the feature of the communication signal and the feature represented by the supervised data, and outputs the correlation coefficient to the fading detection unit 104. The feature represented by the supervised data may be statistic data of amplitudes/phases of fading modeled by means of a theoretical formula, or may be data actually measured under a radio wave environment. For example, a feature is calculated from measurement data of a radio wave under an environment simulating a multipath environment and is specified in advance to be used as supervised data for detecting presence or absence of a multipath fading variation.

The fading detection unit 104 detects, based on the correlation coefficient representing the degree of similarity acquired from the similarity calculating unit 103, whether the feature calculated for the time span t includes an effect of a fading variation. Specifically, the fading detection unit 104 compares a magnitude relationship between a predetermined threshold value Y and the degree of similarity (correlation coefficient) C, and outputs the comparison result, the degree of similarity, the feature, and the time span t to the time span control unit 105. The time span control unit 105 determines, based on the comparison result, whether to perform recalculation or complete the processing in accordance with whether the effect of the fading variation is included.

The time span control unit 105 determines, based on the comparison result by the fading detection unit 104, whether to perform recalculation or complete the processing. When the degree of similarity C is greater than the threshold value, the time span control unit 105 instructs the feature quantity calculating unit 102 to changes the time span $t_n$ to a new time span $t_{n+1}$ and calculate the feature for the new time span $t_{n+1}$. The feature quantity calculating unit 102 performs the subsequent processing for the new time span $t_{n+1}$ sequentially in the same manner, and repeats recalculation until the fading detection unit 104 determines to complete the processing. When it is determined, based on the result of comparison between the degree of similarity and the threshold value by the fading detection unit 104, that the degree of similarity is equal to or less than the threshold value, the time span control unit 105 retains the feature, the time span, and the degree of similarity and complete the calculation.

At this point, with regard to the change control of the time span t, the time span control unit 105 reduces the time span by an arbitrary ratio every time recalculation is performed for the time span $t_n$. With this operation, it is expected that the fluctuation component of the desired communication signal, which is the observed object, and the fluctuation component due to fading may be separated.

Figure 2:
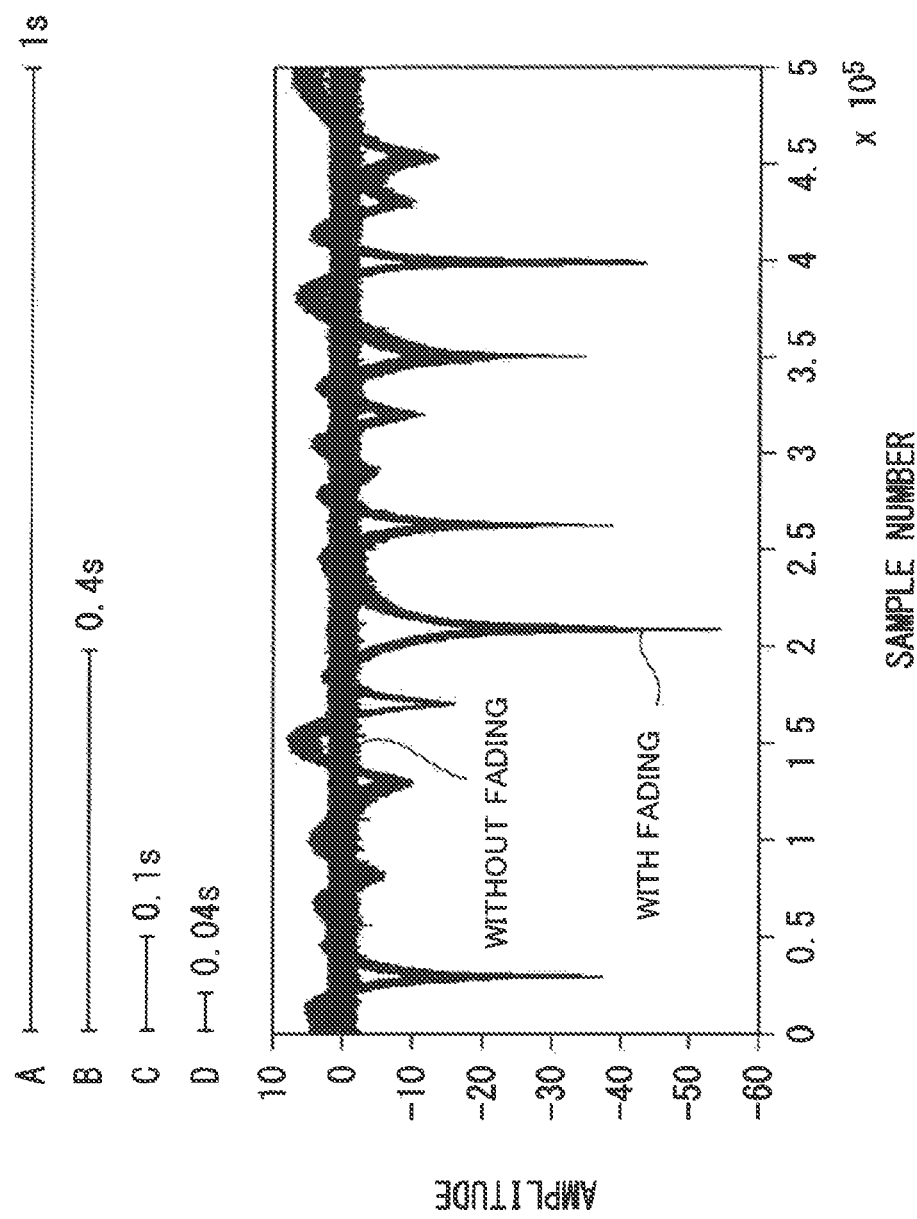
FIG. 2 is a diagram illustrating time series data of amplitude fluctuation of a communication signal with or without fading.

FIG. 2 is a diagram illustrating time series data of amplitude fluctuation of a communication signal with or without fading.

FIG. 2 illustrates, with regard to the amplitudes of the communication signal, the time-series measurement data for a case where fading occurs and a case where fading does not occur, overlapped with each other. The measurement data is an example in which the sampling rate is $5 \times 10^5$ (samples/s), the SNR (Signal to Noise Ratio)=20 dB, and the fading period is 5 Hz, and it is assumed to be measurement data under an environment with poor visibility (non-line-of-sight environment).

As illustrated in FIG. 2, in general, amplitude fluctuation due to fading is significantly greater than variation of a communication signal. Therefore, when the feature is calculated for a long time span, the variation of the communication signal is buried in the characteristic of fading having large variation.

In this case, the amplitude fluctuation of the communication signal alone is determined by the symbol rate. In a status where a plurality of signals interfere with each other, amplitude fluctuations are generated due to a phase difference between communication signals. These amplitude fluctuations, which are observed objects in monitoring of a radio wave environment, are in general fluctuations having a frequency component having a frequency of several kilohertz or higher. In contrast, the amplitude fluctuation due to fading is generated by movement of a transmission source or variation of ambient environment; thus, it is a fluctuation having a low frequency component (e.g., several tens of hertz or lower). Therefore, a frequency difference exists between the communication signal, which is the real observed object, and the amplitude fluctuation due to fading, which should not be subject to evaluation; thus, it is possible to remove the fluctuation due to fading from the feature by appropriately controlling the time span for the feature calculation.

Figure 3:
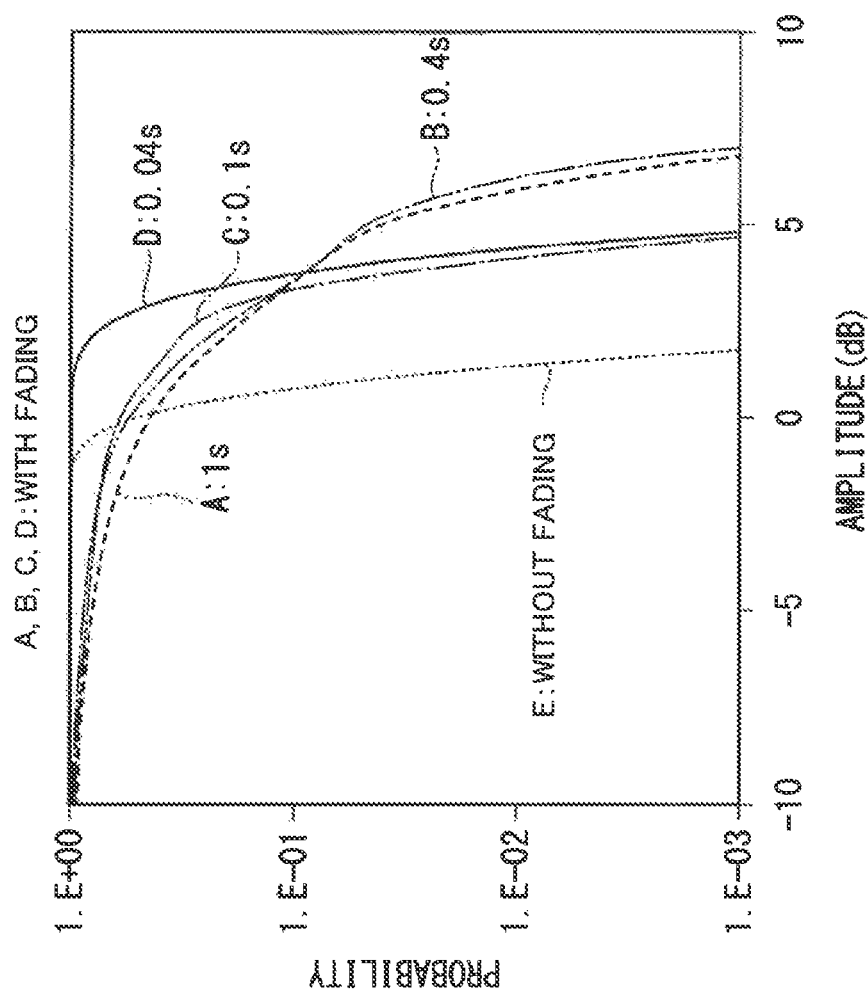
FIG. 3 is a diagram illustrating amplitude probability distributions calculated for different time spans.

FIG. 3 is a diagram illustrating amplitude probability distributions calculated for different time spans.

FIG. 3 illustrates amplitude probability distributions, which are features for respective time spans having different durations.

In the upper part of FIG. 2, the durations corresponding to respective time spans from A to D are illustrated. FIG. 3 illustrates amplitude probability distributions for respective time spans from A to D. In FIG. 3, E indicates an amplitude probability distribution when there is no fading; in this case, the signal component has small amplitude fluctuation and the amplitude probability distribution exhibits a drastic variation. It should be noted that, for signals applied with modulation with respect to frequency such as a frequency modulation (FM) or the Frequency Shift Keying (FSK), the amplitude probability distribution is highly likely to exhibit such a drastic curve.

In contrast, with respect to the amplitude probability distributions indicated by A to D when fading occurs, the amplitude probability distribution indicated by A where the time span is one second exhibits a curve totally different from that when there is no fading. This is because a characteristic of a fading variation appeared. As the time span is reduced to 0.4 second, 0.1 second, . . . , the curve of the amplitude probability distribution gradually approaches the curve when there is no fading, and it is evident that, although there is a difference in amplitude strength, the amplitude probability distribution when the time span is 0.04 second, which is indicated by D, exhibits a similarly drastic curve. This is because a period of fading is outside the time for the feature calculation by reducing the time span t.

As described above, even under fading environment, as the time span t for generating measurement data is reduced, the feature for the time span t obtained from the measurement data will not contain a fading period, and the characteristic of the communication signal will be prominent.

Next, an operation of the feature quantity measuring device 100 will be specifically described.

The similarity calculating unit 103 calculates the correlation coefficient (degree of similarity) between the communication signal and the amplitude probability distribution of the fading variation by means of the equation 3 and the like. In this case, in a calculation for the time span of one second, the correlation coefficient is a high value and the fading detection unit 104 is required to determine that the correlation coefficient contains a fading variation (i.e., "recalculation"). In contrast, when the time span is reduced to 0.4 second, 0.1 second, . . . , the correlation coefficient gradually decreases, and an appropriate threshold value is set in the operation of the fading detection unit in such a way that the fading detection unit determines that a fading variation is not contained when the time span is 0.04 second. In setting of the threshold value, an appropriate value may be adjusted through simulation, preliminary measurement by actual measurement, or the like.

As the supervised data used by the similarity calculating unit 103 for detecting fading, a feature representing a characteristic when there is a fading variation as illustrated by a curve of the amplitude probability distribution indicated by A in FIG. 3 is used. It should be noted that, as the supervised data, a feature for a longer time span in order to obtain a highly reliable result up to a sufficiently low probability, or a feature calculated from a theoretical value may be desirably used. A reduction ratio for the time span may be freely set, for example, by reducing the time span by 50% for each recalculation, or the like. Alternatively, the time span may be controlled in such a way that it does not become extremely small, by calculating a variation $\Delta r_n$ of the correlation coefficient $r_n$ and decreasing the ratio for reducing the time span as $\Delta r_n$ decreases, or the like.

Situations that haven not been considered in the description thus far include a situation in which a signal having a frequency of a desired communication signal may not be acquired and only ambient noise may be acquired. It is known that, when ambient noise is Gaussian noise, the feature after detection of the envelope of the ambient noise is Rayleigh distributed, which is the same type of characteristic as multipath fading; thus, it is considered that the degree of similarity becomes high. To avoid this, it is desired to receive a signal having a certain amplitude level or higher by preparing a trigger or the like in such a way that the acquiring unit 101 performs measurement when the signal level has a certain magnitude or higher. By setting a trigger level, not only calculation in a situation in which no signal exists but also a situation in which the level of a radio wave is drastically reduced due to the effect of fading and an SNR is reduced to a level that affects the feature may be avoided.

Although not illustrated in FIG. 1, the feature quantity measuring device 100 may include a storage unit that accumulates the feature and a determination result. The storage unit may be provided external to the feature quantity measuring device 100.

In addition, the supervised data for the feature of fading, which is retained in advance in the fading detection unit 104, may be stored in the storage unit. Furthermore, the feature quantity measuring device 100 may include an output unit for outputting the feature, the time span, the fading detection result, and the like to the outside. The output unit is, for example, a display or a printer, or an alarming device for notification of occurrence of an error, and outputs the feature and the determination result by displaying or the like. With the aforementioned configuration, the feature quantity measuring device 100 automatically selects a time span that does not contain fading in a feature.

(Description of the Operation)

Figure 4:
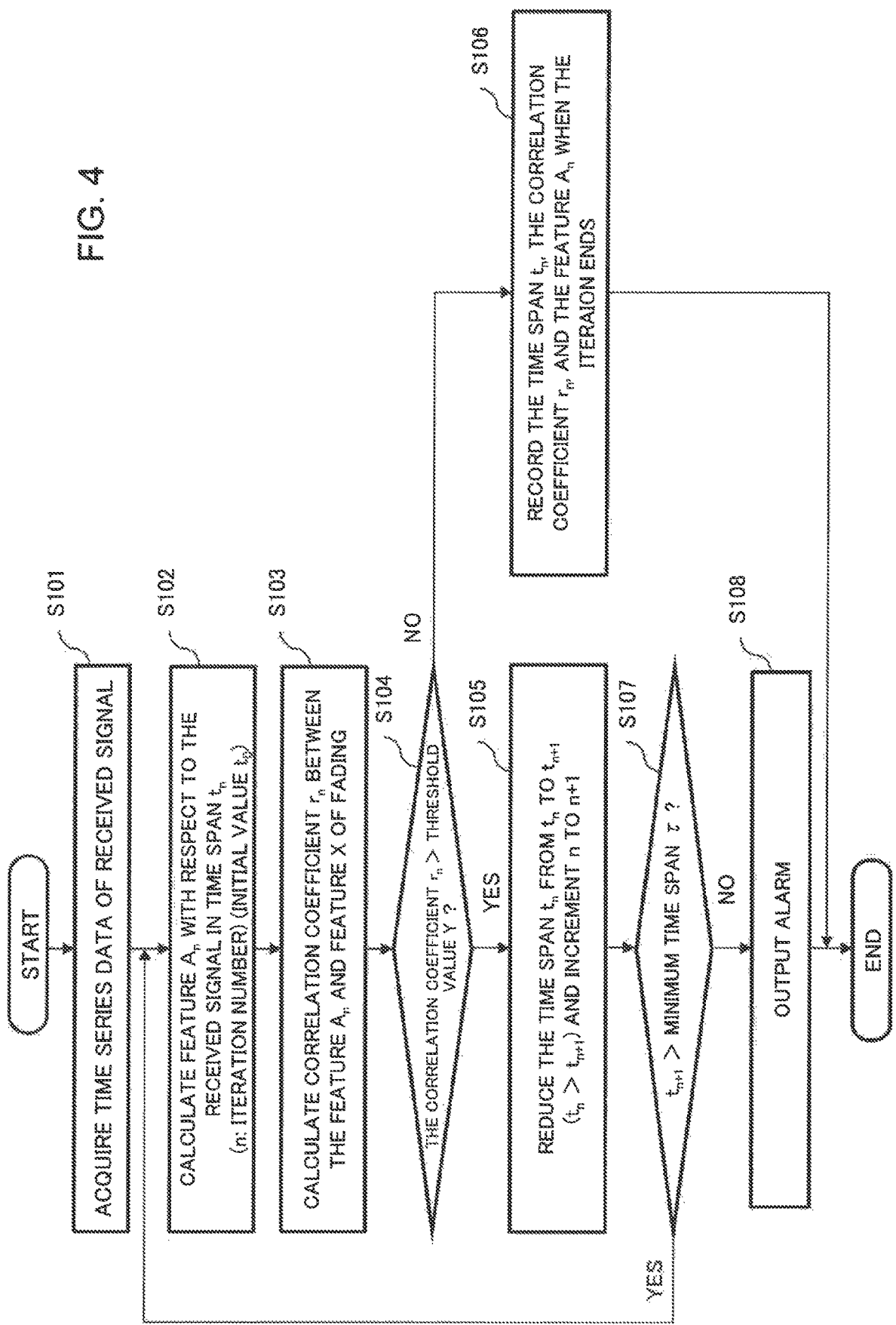
FIG. 4 is a diagram illustrating a processing sequence of the feature quantity measuring device according to the first example embodiment of the present invention.

FIG. 4 is a diagram illustrating a processing sequence of the feature quantity measuring device according to the first example embodiment.

Next, the operation of the present example embodiment will be described in detail with reference to a flowchart of FIG. 4.

When the feature quantity measuring device 100 starts measurement of a communication signal, the acquiring unit 101 acquires time series data (measured data) of a newly sampled received signal (step S101). The feature quantity calculating unit 102 then calculates a feature $A_n$ with respect to the received signal in a predetermined time span $t_n$ (step S102). As the technique for calculating the feature, a technique commonly used is used according to the type of the feature. The similarity calculating unit 103 calculates a correlation coefficient (degree of similarity) $r_n$ between the feature $A_n$ of the radio wave and the preset feature X of fading (step S103).

The fading detection unit 104 determines a magnitude relationship between the correlation coefficient $r_n$ and the predetermined threshold value Y (step S104). Specifically, the fading detection unit 104 determines whether the correlation coefficient $r_n$ is greater than the threshold value Y and notifies the time span control unit 105 of the determination result. The time span control unit 105 determines that, when the correlation coefficient $r_n$ is greater than the threshold value Y (step S104—YES), the time series data of the received signal contains a fading variation. The time span control unit 105 then determines a new time span $t_{n+1}$ that is reduced from the time span $t_n$ (step S105). Note that the new time span $t_{n+1}$ is shorter than the time span $t_n$. On the other hand, when the correlation coefficient $r_n$ is equal to or less than the threshold value Y (step S104—NO), the time span control unit 105 records the feature $A_n$, the correlation coefficient $r_n$ and the time span $t_n$ in the storage unit (step S106), and completes measurement.

The time span control unit 105 further determines whether the newly determined time span $t_{n+1}$ is greater than the predetermined minimum time span τ (step S107). When the new time span $t_{n+1}$ is greater than the minimum time span τ (step S107—YES), the time span control unit 105 instructs the feature quantity calculating unit 102 to recalculate the feature for the new time span $t_{n+1}$. The feature quantity calculating unit 102 recalculates the feature for the new reduced time span $t_{n+1}$, and continues the steps from step S102. When the new time span $t_{n+1}$ is equal to or less than the minimum time span τ (step S107—NO), the time span control unit 105 outputs an alarm (step S108), and completes the measurement.

Cases where an alarm is generated may include a case where setting of the threshold value is inappropriate, a case where occurrence of fading having a very short period causes a fading variation to be contained even within a minimum time span τ, a case where a signal having an amplitude fluctuation similar to that of fading is detected, or the like.

Figure 5:
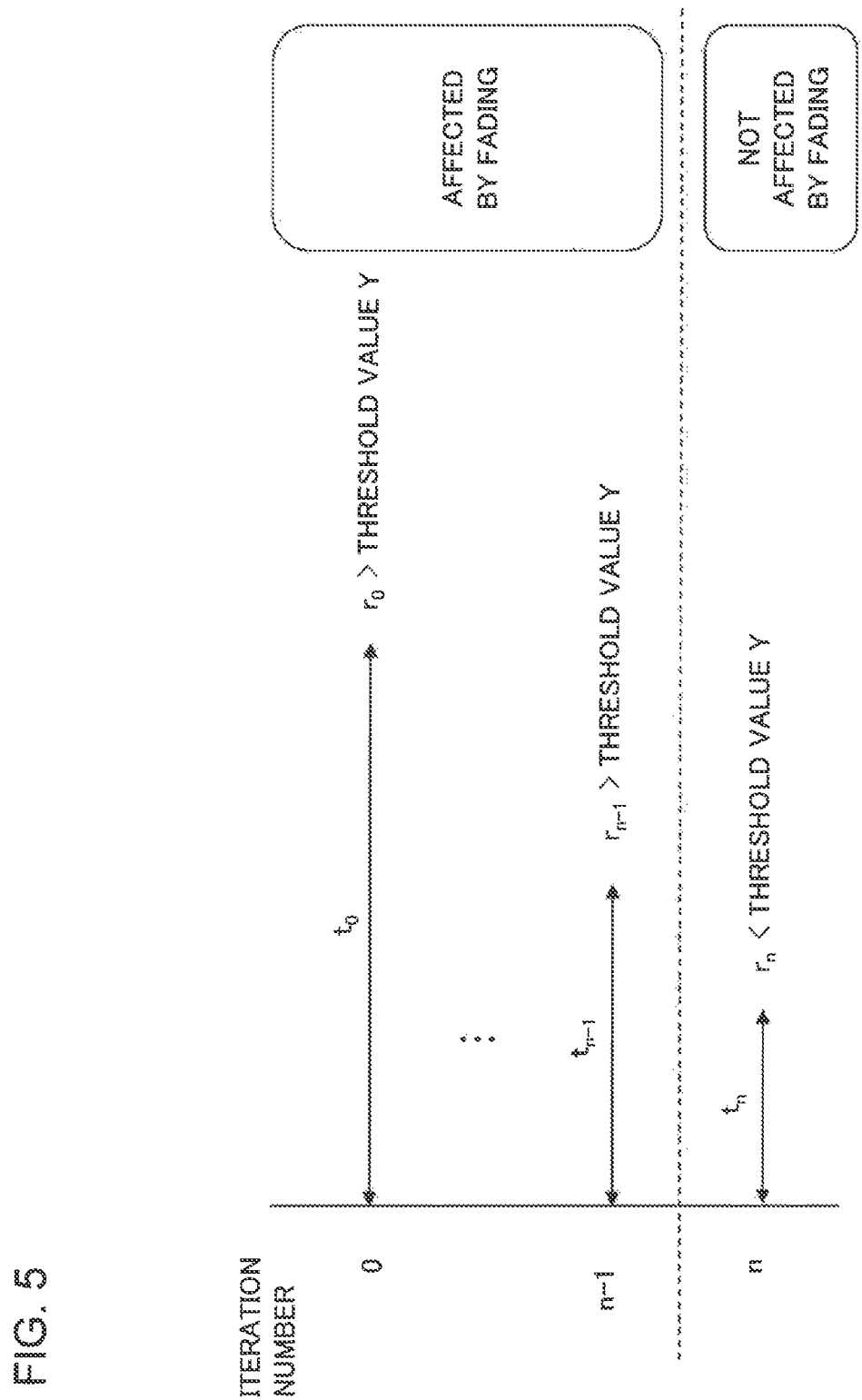
FIG. 5 is a diagram illustrating an example of a determination method of a time span and a threshold value according to the first example embodiment of the present invention.

FIG. 5 is a diagram illustrating an outline of the processing of the feature quantity measuring device.

The time span control unit 105 reduces the time span sequentially to $t_0, \ldots, t_{n-1}, t_n$ as illustrated in FIG. 5. In conjunction with this, the correlation coefficient for each time span under fading environment sequentially lowered to $r_0, \ldots, r_{n-1}, r_n$. When the correlation coefficient is less than the threshold value, calculation is completed and it is determined that the characteristic of the fading variation is not contained.

Next, the minimum time span τ in the feature calculation will be described.

In the feature calculation, while reducing the time span t makes it possible not to include the effect of the fading variation in the feature, it does not mean that the shorter time span t is better, and there is a lower limit of the time span t required for accuracy of the feature calculation.

Figure 6:
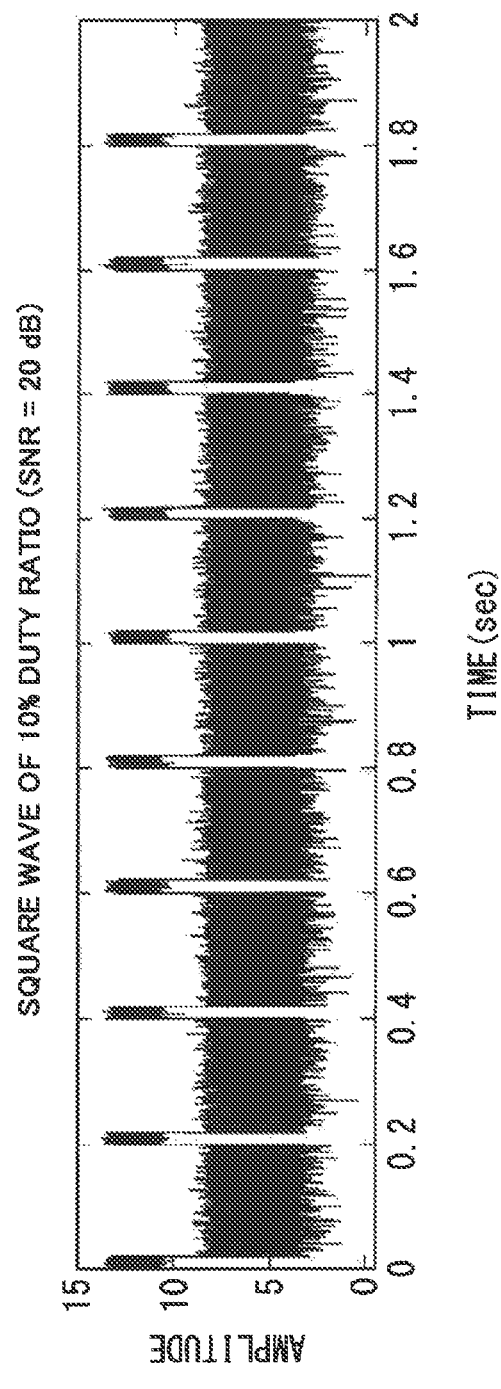
FIG. 6 is a diagram illustrating an example of time series data of a received signal.

FIG. 6 illustrates an example of time series data of a received signal, which is a square wave, measured for two seconds at a sampling rate of $1 \times 10^5$ (samples/s). In this case, it is assumed that the SNR (Signal to Noise Ratio)=20 dB and that the duty ratio of the square wave is 10%.

Figure 7:
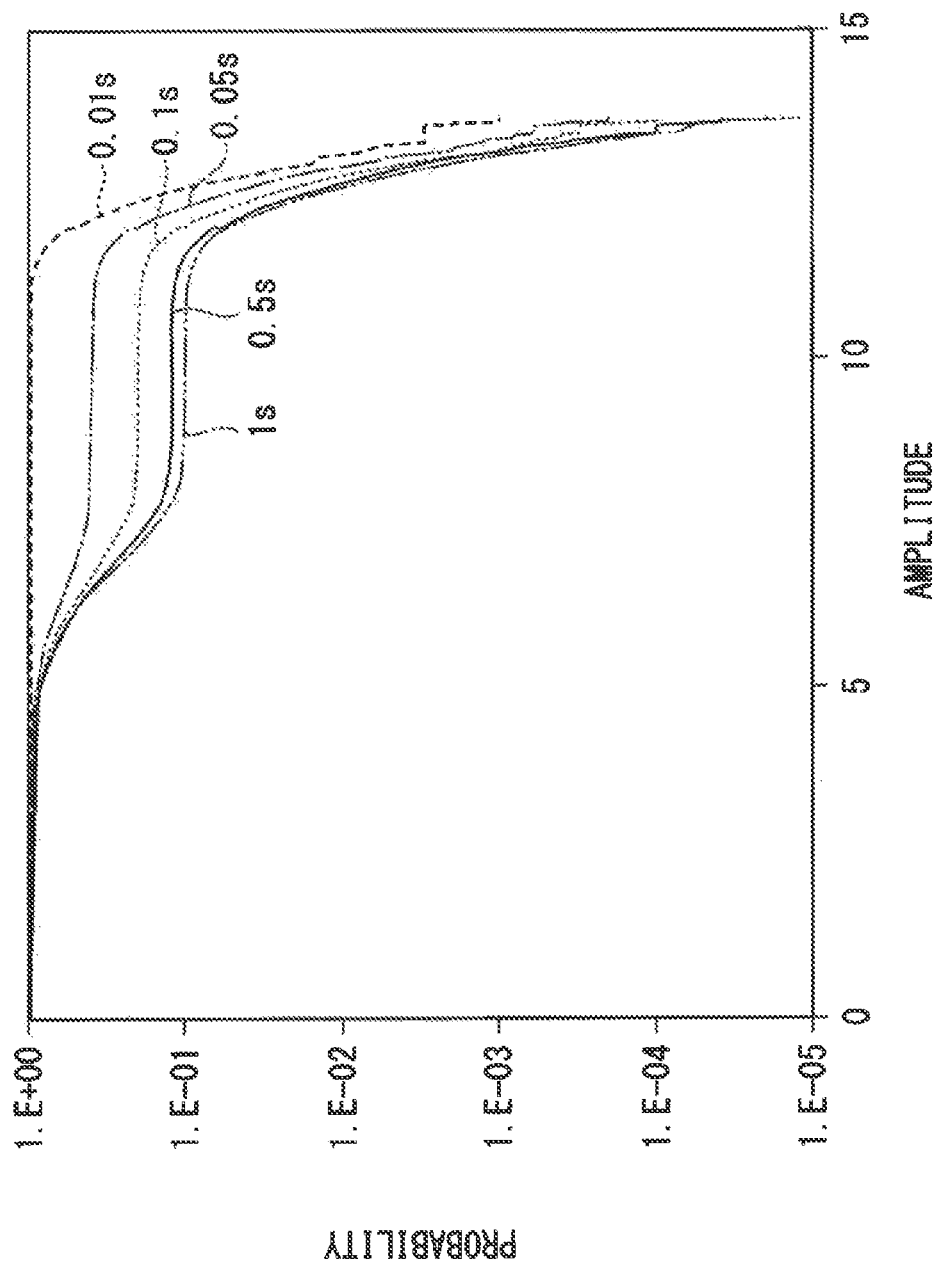
FIG. 7 illustrates amplitude probability distributions of the time series data of the received signal measured in different time spans.

FIG. 7 illustrates amplitude probability distributions of the time series data of the received signal, which is illustrated in FIG. 6, measured in different time spans. It is evident that the curve of the amplitude probability distribution varies with respect to the time span t varied from 0.01 second to one second. In this case, since the duty ratio of the square wave is 10%, it may be considered that the amplitude probability distribution having an inflection point at probability of 0.1 indicates a statistically correct characteristic. In this example, it is therefore found that the amplitude probability distribution for a time span t shorter than one second has low reliability. Note that, although it is not illustrated, the amplitude probability distributions for measurement times equal to or longer than one second coincide with each other.

As is evident from the equation 1, the amplitude probability distribution is expressed as a time rate where the amplitude is the variable; thus, the total measurement time T is an important parameter. While measurement is usually performed assuming that time series data of a signal to be measured are steady, when the total measurement time T is short and the number of sampled time series data is not sufficient, the amplitude value $E_k$ is not properly averaged and accuracy as a statistic is reduced.

When a minimum probability to be observed is P and the sampling rate is Fs (samples/s), it is assumed that 100 samples are required for the minimum probability P in an amplitude probability distribution from a standpoint of statistic reliability; in this case, the required minimum time span τ is expressed by an equation 4. From the equation 4, the acquiring unit 101 determines the minimum time span τ from the sampling rate and the probability value P required for observation. It is found that, as the probability value that assures accuracy decreases, the minimum time span τ is required to be long.

[Math 4]

$$\tau = \frac{100}{Fs \times P} \quad (4)$$

After a series of processing is completed, the acquiring unit 101 receives a new signal for monitoring of the radio wave environment, and repeats measurement. For each measurement, the feature quantity calculating unit 102 calculates a feature and compares the feature with the supervised data. It is desired that a feature $A_n$ for a time span that does not contain a fading variation is recorded every time the process is repeated.

While an initial value $t_0$ for the time spans is a maximum value of durations for collecting data sampled by the acquiring unit 101, it is not necessarily required to use the same value for the initial value $t_0$ for the time spans in the second or subsequent processing. In other words, it may be configured to calculate the feature using the time span $t_n$ determined in the initial processing.

In the aforementioned description, it is configured that the time span control unit 105 instructs the time span used by the feature quantity calculating unit 102; however, it may be configured that the time span $t_n$ finally applied is set as an acquisition time for a received signal that is newly acquired by the acquiring unit 101. This configuration enables time series data to be used without wasting the data as a feature after the time span is determined, and processing at the acquiring unit 101 may be reduced.

(Description of the Effect)

According to the example embodiments of the present invention, it is possible to provide the feature quantity measuring device that may automatically determine a period that does not contain fading even under fading environment and measure a feature of a communication signal, which is the observed object.

Second Example Embodiment

Next, a feature quantity measuring device according to a second example embodiment will be described.

(Description of the Configuration)

A configuration of the feature quantity measuring device 100 according to the second example embodiment is similar to that of the first example embodiment, which is illustrated in FIG. 1. An operation of the feature quantity measuring device 100 according to the second example embodiment is different as compared with that of the feature quantity measuring device 100 according to the first example embodiment. Specifically, the feature quantity measuring device 100 according to the second example embodiment is different from the first example embodiment in that the feature quantity calculating unit 102 calculates a plurality of features for a plurality of predetermined time spans and thereby does not perform recalculation.

(Description of the Operation)

Figure 8:
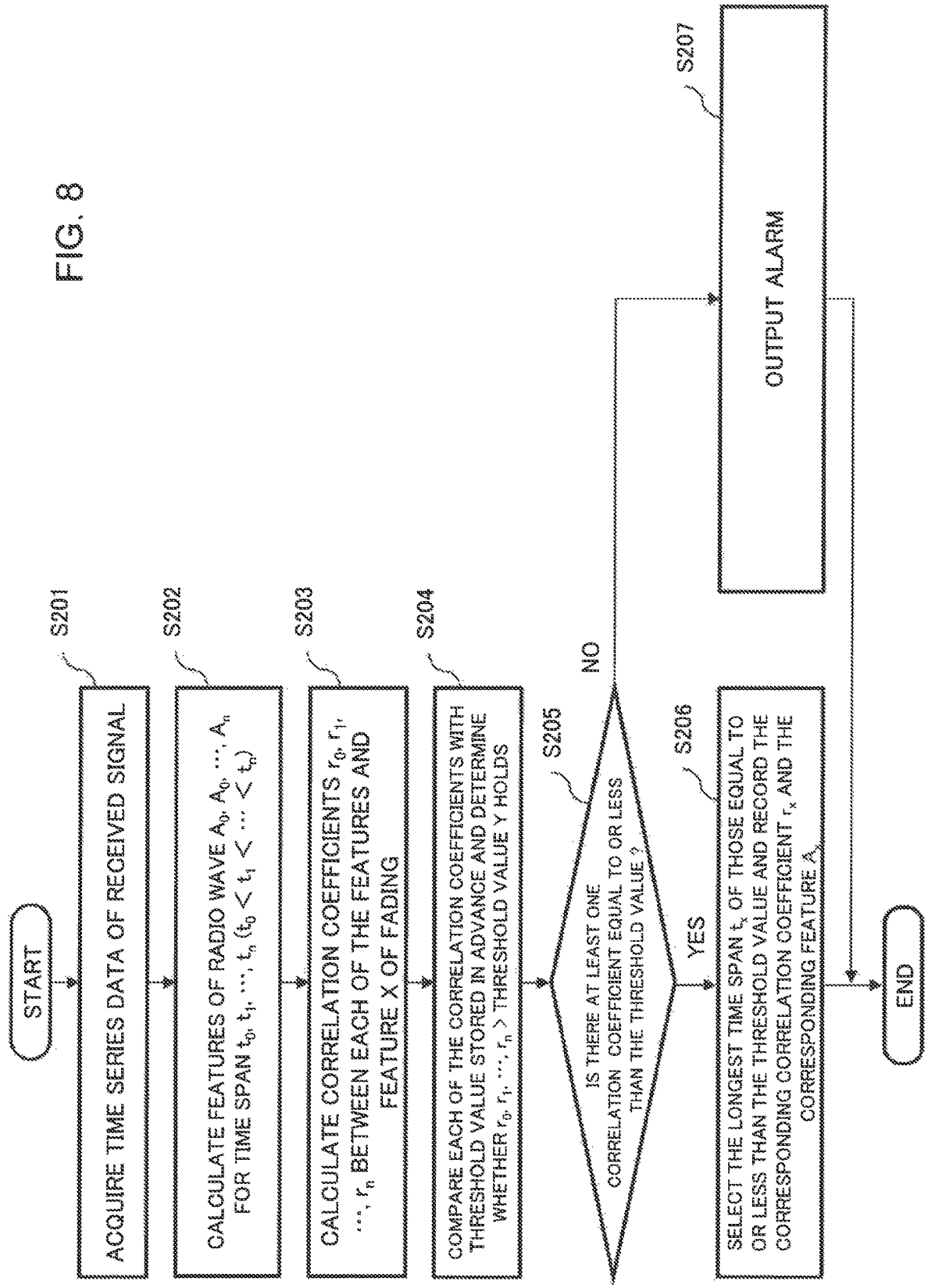
FIG. 8 is a diagram illustrating a processing sequence of a feature quantity measuring device according to a second example embodiment of the present invention.

FIG. 8 is a diagram illustrating a processing sequence of the feature quantity measuring device according to the second example embodiment.

The operation of the second example embodiment will be described in detail with reference to a flowchart of FIG. 8.

When measurement is started, the acquiring unit 101 acquires time series data of a newly sampled received signal (step S201). The feature quantity calculating unit 102 then acquires a group of predetermined time spans and calculates features $A_0, A_1, \ldots, A_n$, based on a plurality of time spans $t_0, t_1, \ldots, t_n$ indicated by the group of time spans (step S202). Subsequently, the similarity calculating unit 103 calculates respective correlation coefficients (degrees of similarity) $r_0, r_1, \ldots, r_n$ between the features $A_0, A_1, \ldots, A_n$ of the radio wave for the plurality of time spans $t_0, t_1, \ldots, t_n$ and a preset feature X of fading (step S203). The fading detection unit 104 determines magnitude relationships between $r_0, r_1, \ldots, r_n$ and a predetermined threshold value Y (step S204).

Specifically, the fading detection unit 104 determines whether any of the correlation coefficient $r_0, r_1, \ldots, r_n$ is greater than the threshold value Y and notifies the time span control unit 105 of the determination result. The time span control unit 105 determines that, when no correlation coefficient is equal to or less than the threshold value Y (step S205—NO), a fading variation is contained, and outputs an alarm. On the other hand, when there is at least one correlation coefficient that is equal to or less than the threshold value Y (step S205—YES), the time span control unit 105 selects the longest time span $t_x$ of the time spans corresponding to the correlation coefficient that is equal to or less than the threshold value, records the corresponding feature Ax and the corresponding correlation coefficient $r_x$ (step S206), and completes measurement.

In the present example embodiment, it is desired that the time span $t_0$, which is the shortest of the time spans $t_0, t_1, \ldots, t_n$, is set as the minimum time span τ in the first example embodiment.

(Description of the Effect)

According to the second example embodiment of the present invention, similarly to the first example embodiment, it is possible to provide the feature quantity measuring device 100 that may automatically determine a period that does not contain fading even under fading environment and measure a feature of a communication signal, the feature being an object to be observed. While the series of processing gets heavier, recalculation process becomes unnecessary; thus, an advantage that the calculation completes with the same processing irrespective of radio wave environment is obtained.

Third Example Embodiment

Next, a feature quantity measuring device according to a third example embodiment will be described.

(Description of the Configuration)

A configuration of the feature quantity measuring device 100 according to the third example embodiment is similar to that of the first example embodiment, which is illustrated in FIG. 1. An operation of the feature quantity measuring device 100 according to the third example embodiment is different from those of the feature quantity measuring device 100 according to the first and second example embodiments. Specifically, the feature quantity measuring device 100 according to the third example embodiment is different in that the similarity calculating unit 103 stores preset features of a plurality of fading environments as supervised data, and by calculating a plurality of correlation coefficients (degrees of similarity) between the features and respective supervised data, proper supervised data may be selected under environments having different characteristics of fading.

Figure 9:
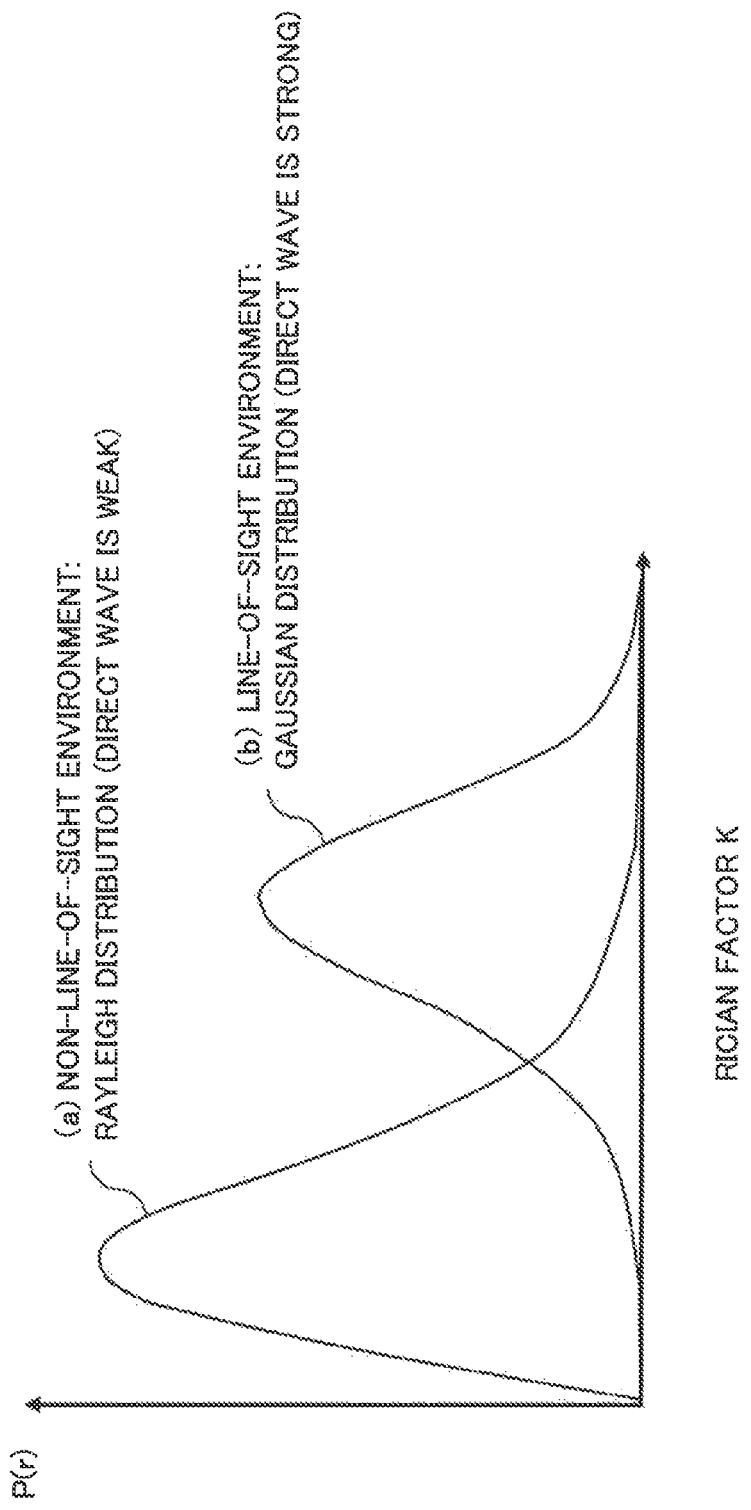
FIG. 9 is a diagram illustrating probability density distributions in accordance with different fading environments.

FIG. 9 is a diagram illustrating probability density distributions in accordance with different fading environments.

Variation of radio waves due to fading is statistically modeled, based on measurement of radio wave propagation. Under a non-line-of-sight environment where there is no incoming wave having a high strength like a direct wave, a complex envelope of a received signal has a complex Gaussian distribution (FIG. 9 (a)). In this case, amplitudes r of the received signal are Rayleigh distributed as expressed by an equation 5. Note that $\sigma^2$ denotes an average received power in the equation 5.

[Math 5]

$$p(r) = \frac{r}{\sigma^2} \exp\left(-\frac{r^2}{2\sigma^2}\right) \quad (5)$$

In contrast, under a line-of-sight environment where an incoming wave having a high strength like a direct wave is applied to a multiple wave environment, it is known that amplitudes r conform to a Nakagami-Rice distribution as expressed by the following equation (FIG. 9 (b)).

Note that v denotes the amplitude of the direct wave and $I_0(X)$ denotes a zeroth-order Bessel function of the first kind. A power ratio K between the direct wave and the scattered waves is referred to as the Rician factor. In the Nakagami-Rice distribution, when K<0 dB (the direct wave is weak) holds, the amplitudes mostly conform to the Rayleigh distribution; when K=∞ dB (only the direct wave is present) holds, there is no fading and the amplitudes approach the Gaussian distribution.

[Math 6]

$$p(r) = \frac{r}{\sigma^2} \exp\left(-\frac{r^2 + v^2}{2\sigma^2}\right) I_0\left(\frac{rv}{\sigma^2}\right) \quad (6)$$

[Math 7]

$$K = \frac{v^2}{2\sigma^2} \quad (7)$$

As described above, since the characteristics are different depending on fading environments, it is necessary to appropriately set supervised data, which are retained in advance to be used by the similarity calculating unit 103, in accordance with the reception environment. In the third example embodiment, since respective characteristics of the non-line-of-sight environment and the line-of-sight environment are summarized in the Nakagami-Rice distribution, features based on a plurality of Nakagami-Rice distributions having different Rician factors are used as supervised data. In this manner, the similarity calculating unit 103 calculates respective degrees of similarity between the plurality of supervised data and the features of the communication signals.

The same number of threshold values, which are used by the fading detection unit 104, as the number of the supervised data are prepared and the fading detection unit 104 compares, for each of the supervised data, the magnitude relationship between the degree of similarity and the threshold value. When there is at least one degree of similarity that is not equal to or less than the threshold value, the time span control unit 105 determines to reduce the time span and perform recalculation, as in the first example embodiment. When a condition that all degrees of similarity are equal to or less than the threshold value is satisfied, the time span control unit 105 records the features, the time spans, and the degrees of similarity in the storage unit and completes measurement.

(Description of the Operation)

Figure 10:
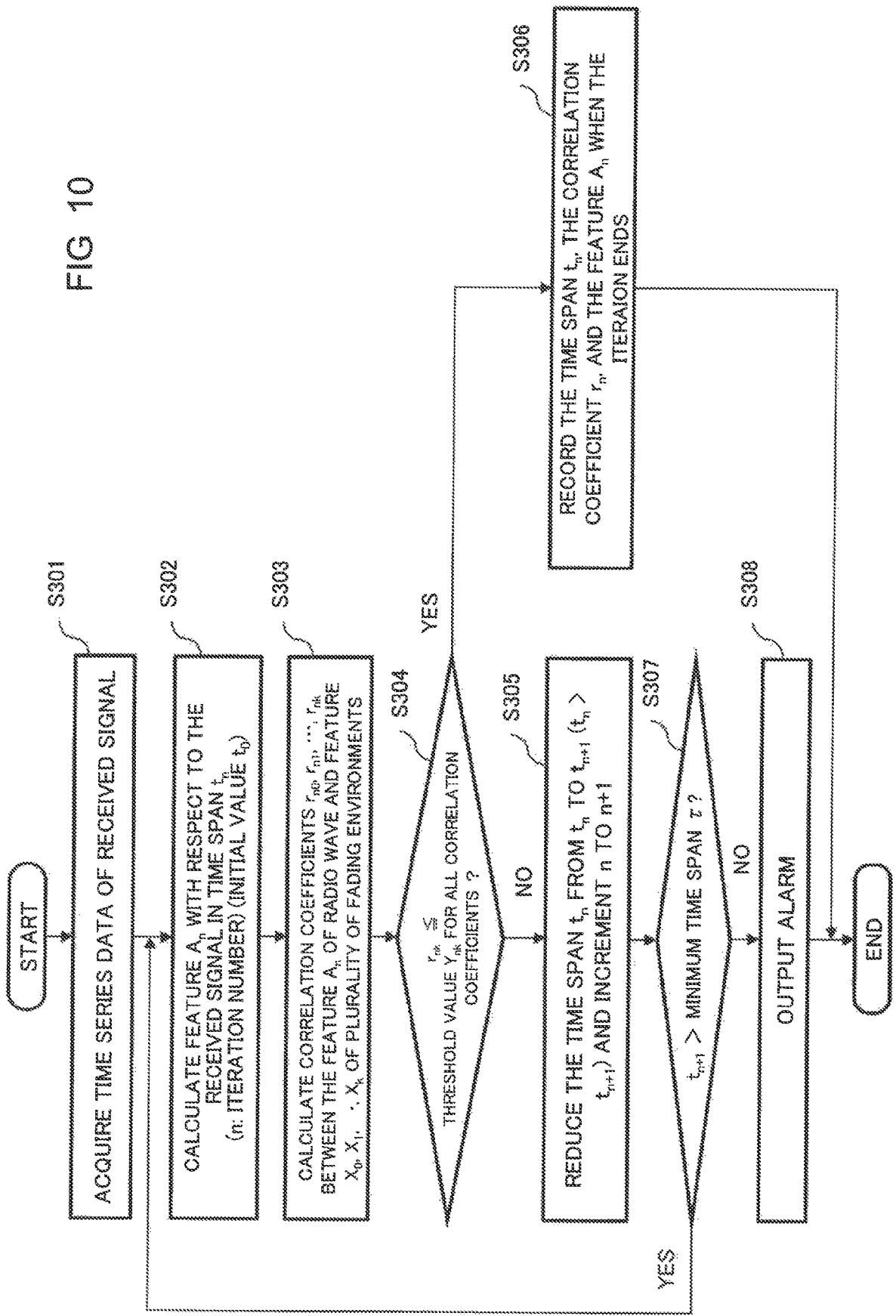
FIG. 10 is a diagram illustrating a processing sequence of a feature quantity measuring device according to a third example embodiment of the present invention.

FIG. 10 is a diagram illustrating a processing sequence of the feature quantity measuring device according to the third example embodiment.

The operation of the third example embodiment will be described in detail with reference to a flowchart of FIG. 10.

When measurement is started, the acquiring unit 101 acquires time series data of a newly sampled received signal (step S301). The feature quantity calculating unit 102 then calculates features $A_n$ for a predetermined group of time spans $t_n$ (step S302). Subsequently, the similarity calculating unit 103 calculates respective correlation coefficients (degrees of similarity) $r_{n0}, r_{n1}, \ldots, r_{nk}$ between the features $A_n$ of the radio wave for the time spans $t_n$ and the preset features $X_0, X_1, \ldots, X_k$ of fading having different Rician factors (step S303).

The fading detection unit 104 determines, using the correlation coefficients (degrees of similarity) $r_{n0}, r_{n1}, \ldots, r_{nk}$ and the corresponding predetermined threshold values $Y_{n0}, Y_{n1}, \ldots, Y_{nk}$, respective magnitude relationships between the correlation coefficients and the corresponding threshold values (step S304). Specifically, the fading detection unit 104 compares the correlation coefficient $r_{n0}$ with the threshold value $Y_{n0}$, the correlation coefficient $r_{n1}$ with the threshold value $Y_{n1}, \ldots,$ the correlation coefficient $r_{n1}$ with the threshold value $Y_{n1}$, respectively. The fading detection unit 104 then notifies the time span control unit 105 of respective comparison results. The time span control unit 105 determines that, when there is at least one correlation coefficient that is greater than the threshold value in the comparison result (step S304—NO), a fading variation is contained and determines a new time span $t_{n+1}$ that is reduced from the time span $t_n$ (step S305). On the other hand, when all correlation coefficients $r_n$ are equal to or less than the threshold value Y (step S304—YES), the time span control unit 105 records the features $A_n$, the correlation coefficients $r_{n0}, r_{n1}, \ldots, r_{nk}$, and the time spans $t_n$ in the storage unit (step S306), and completes the measurement. Since the operation after the time span $t_n$ is reduced, i.e., the operation in step S307 and the subsequent steps, is a similar operation as that in the first example embodiment, description thereof is omitted.

(Description of the Effect)

According to the third example embodiment, similarly to the first and the second example embodiments, it is possible to provide the feature quantity measuring device that may automatically determine a period that does not contain fading even under fading environment and measure a feature of a communication signal, which is the observed object. When a radio wave environment is measured using a plurality of feature quantity measuring devices 100, there is an advantage that a status of the fading environment at each reception point may be understood in more detail. Furthermore, there is an advantage that the feature quantity measuring devices 100 are not required to be separately configured even under different fading environments.

Other Example Embodiments

While each example embodiment of the present invention has been described above in detail with reference to drawings, specific configurations are not limited to those of the example embodiments, and designs and the like without departing from the summary of the present invention are included. For example, an existing means for reducing amplitude fluctuation due to fading, such as diversity or circuit compensation, which are a technique applicable to an unknown signal, may be combined with the embodiments. The feature quantity measuring device 100 may be combined with spatial diversity in which a plurality of antennas are spatially disposed.

For example, the degree of similarity calculated by the similarity calculating unit 103 is not limited to the Pearson's correlation coefficient, and other correlation coefficients may be used. As a degree of dissimilarity, a distance function such as the Euclidean distance or the Manhattan distance may be used. When a distance function is used, as data are more similar, the value becomes smaller; therefore, the inequality sign between the value and the threshold value in the fading detection unit 104 needs to be reversed as compared with the case of using the correlation coefficient.

In addition, a radio wave environment measuring device may be configured by disposing a plurality of the aforementioned feature quantity measuring devices 100 of the first example embodiment on a spatial coordinate system and adding a connection unit that connects respective feature quantity measuring devices 100 wirelessly or in a wired fashion to a network environment such as the Internet.

Figure 11:
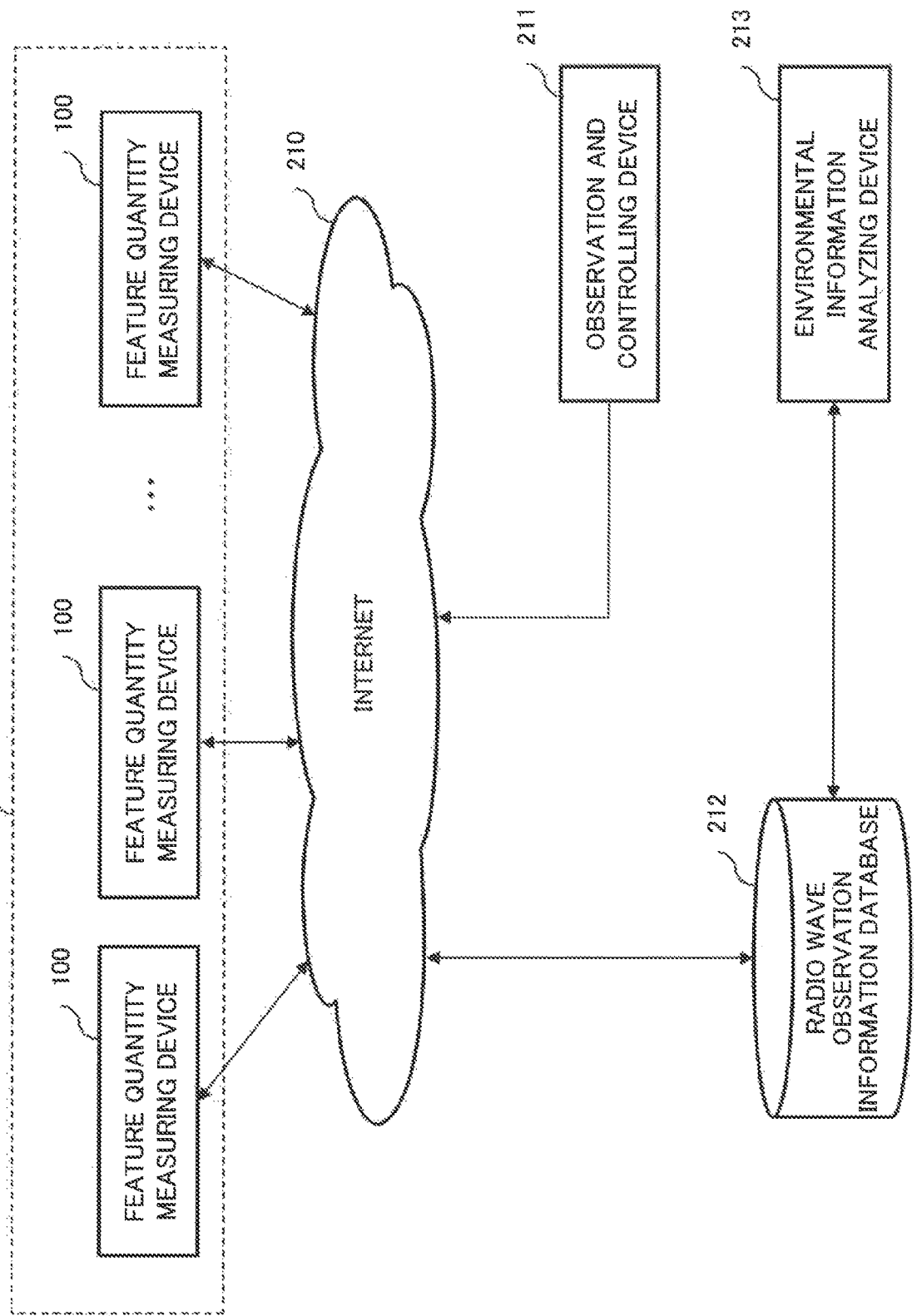
FIG. 11 is a diagram illustrating an example of a configuration of a radio wave environment measuring device according to an example embodiment of the present invention.

FIG. 11 is a diagram illustrating an example of a configuration of the radio wave environment measuring device.

The radio wave environment measuring device illustrated in FIG. 11 includes a group of feature quantity measuring devices 200, which consists of a plurality of the feature quantity measuring devices 100 each of which is connected to the Internet 210, an observation and controlling device 211 that controls each of the feature quantity measuring devices 100 via the Internet, a radio wave observation information database 212 that acquires and retains features observed by the respective feature quantity measuring devices 100 via the Internet, and an environmental information analyzing device 213 that analyzes the database. The feature quantity measuring devices 100 are respectively disposed at spatially different positional coordinates.

By analyzing the features accumulated in the radio wave observation information database 212 by the environmental information analyzing device 213, a search for a radio wave usage status or a free frequency band may be possible. In this case, information about the features and the time spans provides very useful information in analysis. For example, when it is determined that a feature contains a fading variation in a short time span, it may be determined that fading having a short period is occurring at observation points where reception is made by the feature quantity measuring device 100. With this analysis, a moving speed of a generation source of a signal or a frequency thereof may be estimated and the signal may be identified.

Each of the aforementioned devices includes a computing system inside. Steps of the aforementioned respective processes are stored in the form of a program on a computer-readable storage medium, and the respective processes are executed by the computer reading out and executing the program. The computer-readable storage medium is a magnetic disc, a magneto-optical disc, a CD-ROM (Compact Disc-Read Only Memory), a DVD-ROM (Digital Versatile Disc-ROM), a semiconductor memory, or the like. The computer program may be distributed to the computer via a communication line and the computer that receives the distributed copy may execute the program.

The program described above may be for implementing a part of the aforementioned function.

Furthermore, the program may implement the aforementioned function in combination with a program already recorded in the computing system, in other words, the program may be a so-called differential file (differential program).

This application claims priority to Japanese Patent Application No. 2016-096962 filed on May 13, 2016, the entire disclosure of which is incorporated herein.

INDUSTRIAL APPLICABILITY

According to the present invention, even when monitoring a radio wave environment under fading environment, a system that can acquire a highly accurate feature of a signal in a simple configuration may be provided. In addition, by preparing a database of the acquired features, the present invention is applicable to a system that assists designing an arrangement of radio wave stations or a system that assists allocation of a frequency and optimization of a transmission power in order to facilitate safer and fair utilization of radio waves.

REFERENCE SIGNS LIST 100 feature quantity measuring device
101 acquiring unit
102 feature quantity calculating unit
103 similarity calculating unit
104 fading detection unit
105 time span control unit
200 group of feature quantity measuring devices
210 Internet
211 observation and controlling device
212 radio wave observation information database
213 environmental information analyzing device

What is claimed is:
1. A feature quantity measuring device, comprising:
an acquiring circuit configured to acquire time series data from a received signal;
a feature quantity calculating circuit configured to calculate a feature, based on data in a predetermined time span of the time series data;
a degree of similarity calculating circuit configured to calculate a degree of similarity between the feature based on the data in the time span and supervised data representing a preset feature when there is a long-period variation;
a long-period variation detecting circuit configured to output a comparison result indicating a magnitude relationship between the degree of similarity and a predetermined threshold value; and
a control circuit configured to determine, based on the comparison result, whether a characteristic of the long-period variation is contained within the time span and, when the characteristic is not contained, output the feature for the time span,
wherein, when determining that the long-period variation is contained within the predetermined time span, the control circuit instructs the feature quantity calculating circuit of recalculation of a feature for a new time span reduced from the time span and the recalculation is repeated until the control circuit determines that the time span does not contain the characteristic of the long-period variation within the time span.

2. The feature quantity measuring device according to claim 1,
- wherein the feature quantity calculating circuit calculates a plurality of corresponding features, based on data in a plurality of time spans having different durations of the time series data,
- wherein the degree of similarity calculating circuit calculates respective degrees of similarity between the plurality of features and the supervised data,
- wherein the long-period variation detecting circuit outputs comparison results respectively indicating a magnitude relationship between each of degrees of similarity between the plurality of features and the supervised data, and a predetermined threshold value; and
- wherein the control circuit determines, based on the respective comparison results, whether the characteristic of the long-period variation is contained within the time span and, when the characteristic is not contained, outputs the feature for the time span.

3. The feature quantity measuring device according to claim 1,
- wherein the supervised data are data representing features based on theoretical values or actual measured values under a plurality of different long-period variation environments.

4. A radio wave environment measuring device, comprising:
- the feature quantity measuring devices according to claim 1 disposed at spatially different positional coordinates; and
- a database configured to acquire and store the feature, which is calculated by the feature quantity measuring devices, for the time span that does not contain the characteristic of the long-period variation.

5. The feature quantity measuring device according to claim 2,
- wherein the supervised data are data representing features based on theoretical values or actual measured values under a plurality of different long-period variation environments.

6. A radio wave environment measuring device, comprising:
- the feature quantity measuring devices according to claim 2 disposed at spatially different positional coordinates; and
- a database configured to acquire and store the feature, which is calculated by the feature quantity measuring devices, for the time span that does not contain the characteristic of the long-period variation.

7. A radio wave environment measuring device, comprising:
- the feature quantity measuring devices according to claim 3 disposed at spatially different positional coordinates; and
- a database configured to acquire and store the feature, which is calculated by the feature quantity measuring devices, for the time span that does not contain the characteristic of the long-period variation.

8. A feature measuring method, comprising:
- acquiring time series data from a received signal;
- calculating a feature, based on data in a predetermined time span of the time series data;
- calculating a degree of similarity between the feature based on the data in the time span and supervised data representing a preset feature when there is a long-period variation;
- outputting a comparison result indicating a magnitude relationship between the degree of similarity and a predetermined threshold value;
- determining, based on the comparison result, whether a characteristic of the long-period variation is contained within the time span;
- when the characteristic is not contained within the time span, outputting the feature for the time span;
- when determining that the long-period variation is contained within the predetermined time span, recalculating a feature for a new time span reduced from the time span and repeating calculating the degree of similarity and outputting the comparison result until the time span does not contain the characteristic of the long-period variation within the time span.

9. A non-transitory storage medium storing instructions that are executable to perform processing comprising:
- acquiring time series data from a received signal;
- calculating a feature, based on data in a predetermined time span of the time series data;
- calculating a degree of similarity between the feature based on the data in the time span and supervised data representing a preset feature when there is a long-period variation;
- outputting a comparison result indicating a magnitude relationship between the degree of similarity and a predetermined threshold value;
- determining, based on the comparison result, whether a characteristic of the long-period variation is contained within the time span;
- when the characteristic is not contained within the time span, outputting the feature for the time span;
- when determining that the long-period variation is contained within the predetermined time span, recalculating a feature for a new time span reduced from the time span and repeating calculating the degree of similarity and outputting the comparison result until the time span does not contain the characteristic of the long-period variation within the time span.

* * * * *